(12) United States Patent
Nakata

(10) Patent No.: US 6,746,912 B2
(45) Date of Patent: Jun. 8, 2004

(54) MIM CAPACITOR AND MANUFACTURING METHOD THEREFOR

(75) Inventor: Hidefumi Nakata, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/383,519

(22) Filed: Mar. 10, 2003

(65) Prior Publication Data

US 2004/0087082 A1 May 6, 2004

Related U.S. Application Data

(62) Division of application No. 09/989,962, filed on Nov. 21, 2001.

(30) Foreign Application Priority Data

Dec. 11, 2000 (JP) .......................................... 2000-375939

(51) Int. Cl.[7] .......................................... H01L 21/8242
(52) U.S. Cl. ............................ 438/250; 438/3; 438/308
(58) Field of Search .............................. 438/3, 238, 240, 438/250, 253, 308, 396

(56) References Cited

U.S. PATENT DOCUMENTS 6,475,854 B2 * 11/2002 Narwankar et al.

FOREIGN PATENT DOCUMENTS

| GB | 2 337 633 | 11/1999 |
| JP | 3-203261 | 9/1991 |
| JP | 7-161833 | 6/1995 |
| JP | 11-354720 | 12/1999 |

* cited by examiner

*Primary Examiner*—Phuc T. Dang
(74) *Attorney, Agent, or Firm*—Keating & Bennett, LLP

(57) ABSTRACT

A downsized, high-capacity MIM capacitor provided on a compound semiconductor includes a lower electrode comprising a plurality of metal layers including a top layer, an upper electrode, and a dielectric layer positioned between the lower electrode and the upper electrode. The entire surface of the top metal layer is oxidized to form an insulating metal oxide layer.

7 Claims, 3 Drawing Sheets

MIM CAPACITOR AND MANUFACTURING METHOD THEREFOR

This application is a Divisional of U.S. patent application Ser. No. 09/989,962 filed Nov. 21, 2001, currently pending.

BACKGROUND OF THE INVENTION

1. Field of the Invention

The present invention relates to a structure of and a manufacturing method for a metal insulator metal (MIM) capacitor in a microwave monolithic integrated circuit utilizing semiconductor technology and, more specifically, compound semiconductor technology.

2. Description of the Related Art

In a monolithic integrated circuit (hereinafter referred to as MMIC), if a bypass capacitor is connected to the outside of a package, noise is caused in a connecting wire between the IC chips and the package, and this small noise causes the deterioration of the IC characteristics. Therefore an MIM capacitor has been used as a bypass capacitor to accommodate power noise.

As an example of a MMIC using such an MIM capacitor, Japanese unexamined patent application publication No.7-21710 discloses an MMIC prepared by depositing on a Ga—As substrate a lower electrode, a silicon oxide layer, a silicon nitride layer, a silicon oxide layer, and an upper electrode in that order.

The MIM capacitor is constructed such that the silicon nitride layer is positioned between silicon oxide layers in order to complement the withstand voltage of the silicon nitride layer. The MIM capacitor however has a problem that the overall dielectric constant becomes lower because silicon oxide has a dielectric constant lower than that of silicon nitride. Also, when the MIM capacitor is prepared on the Ga—As substrate at 400° C. or more, As is liberated and thus the Ga—As substrate deteriorates. Further, when the silicon oxide layers and the silicon nitride layer are deposited at 400° C. by a CVC method, thin and flat silicon oxide layers cannot be formed with half or less than half the thickness of the silicon nitride layer. Hence, a dielectric layer of the MIM capacitor composed of three layers, which are the silicon oxide layer, the silicon nitride layer, and the silicon oxide layer, has twice or more than twice the thickness of a dielectric layer simply composed of silicon nitride layers. Thus, preparing a high-capacity bypass capacitor with an MIM capacitor makes preparing small MMICs difficult because of the large MIM capacitor.

SUMMARY OF THE INVENTION

Accordingly, an object of the present invention is to solve the problems described above by providing a downsized, high-capacity MIM capacitor provided on a compound semiconductor substrate.

To this end, according to one aspect of the present invention, there is provided an MIM capacitor comprising a lower electrode comprising a plurality of metal layers including a top metal layer, an upper electrode, and a dielectric layer positioned between said lower electrode and said upper electrode. The entire surface of the top metal layer is oxidized to form an insulating metal oxide layer.

Pursuant to another aspect of the present invention, there is provided a method of manufacturing an MIM capacitor. The manufacturing method comprises providing a lower electrode comprising a plurality of metal layers, including a top metal layer, and oxidizing the top metal layer of the lower electrode. A dielectric layer is provided on the oxidized top metal layer and an upper layer is provided on the dielectric layer. The dielectric layer may be formed of silicon nitride. The manufacturing method may further comprise oxidizing the dielectric layer. Both oxidizing steps are performed by heating at between 200 and 400° C.

Thus, the metal oxide layer can be formed with a thin thickness without deteriorating the withstand voltage characteristics of the MIM capacitor. As a result, a downsized high-capacity MIM capacitor can be formed, and consequently downsized MMICs can be obtained.

Other features and advantages of the present invention will become apparent from the following description of the invention which refers to the accompanying drawings.

DETAILED DESCRIPTION OF THE PREFERRED EMBODIMENTS

First Embodiment

FIGS. 1 and 2A to 2F illustrate an MIM capacitor and a manufacturing method therefor according to a first embodiment of the present invention.

Figure 1:
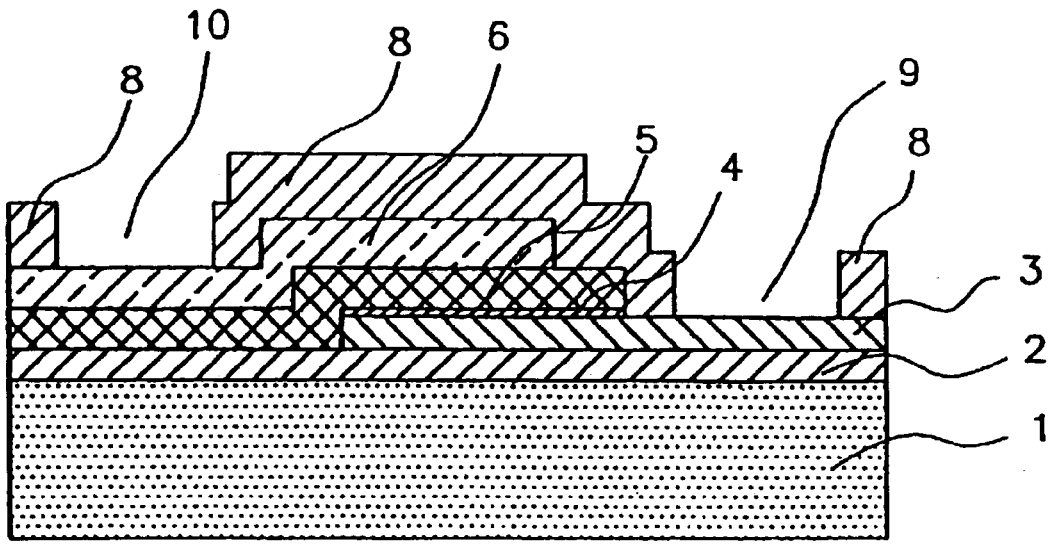
FIG. 1 is a sectional view of an MIM capacitor according to a first embodiment of the present invention.

The MIM capacitor, as shown in FIG. 1 includes a silicon nitride layer 2, a lower electrode 3, a metal oxide layer 4, a dielectric layer 5, and an upper electrode 6 in that order on a Ga—As substrate 1. The dielectric layer 5 is formed of silicon nitride, which has a dielectric constant lower than that of silicon oxide and a high moisture resistance. The metal oxide layer 4, which is highly insulative, is provided on the lower electrode 3 to complement the withstand voltage characteristics of the silicon nitride layer, and thereby the MIM capacitor ensures high withstand voltage characteristics. The lower electrode 3 is formed by depositing a plurality of metal layers. The top of the metal layers is formed of a transition metal or an alloy which is capable of forming an insulating layer by oxidation, and is oxidized to form the metal oxide layer 4.

Then, a protective film 8 of silicon nitride is formed to improve the moisture resistance of the MIM capacitor, and a lower electrode opening 9 and an upper electrode opening 10 are provided to connect the MIM capacitor to external devices.

A method of manufacturing the MIM capacitor will be described below, referring to FIGS. 2A to 2F.

Figure 2A:
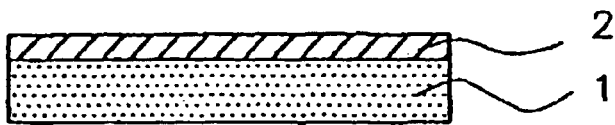
FIGS. 2A to 2F are process drawings of steps employed in manufacturing the MIM capacitor according to the first embodiment of the present invention.

First, the silicon nitride layer 2 is deposited on the Ga—As substrate 1 by a CVD process as shown in FIG. 2A.

Figure 2B:
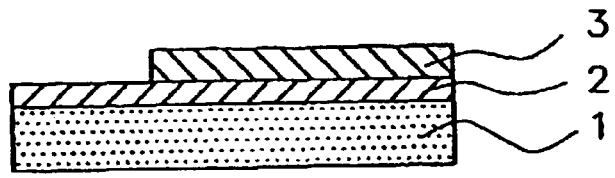

Next, as shown in FIG. 2B, a resist pattern having an inverse-tapered cross-section is provided on the silicon nitride layer, and then a plurality of metal layers are deposited on the upper electrode layer by a vapor deposition and a lift-off process. The lower electrode 3 of this embodiment is formed by depositing a bottom layer formed of highly adhesive titanium, a platinum layer, a gold layer, and a top titanium layer in that order. The top titanium layer has a thickness of 50 nm, whereas the bottom titanium layer has a thickness of at least 20 nm so that the metal oxide layer 4 has improved withstand voltage characteristics.

Figure 2C:
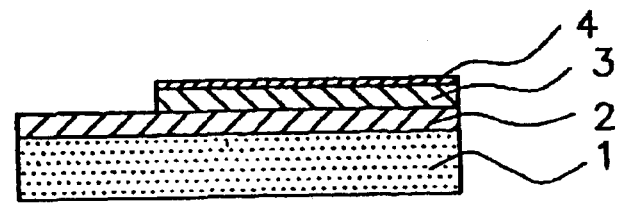

As shown in FIG. 2C, the entire surface of the top titanium layer is oxidized in an oxygen atmosphere at 300° C. to form the metal oxide layer 4 of titanium oxide. Preferably, the oxidation temperature is 200 to 400° C. to sufficiently oxidize titanium without deteriorating the Ga—As substrate, an ohmic electrode of a field effect transistor (FET), or the like.

Figure 2D:
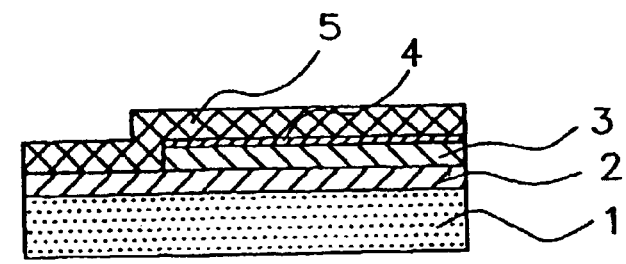

Next, as shown in FIG. 2D, the dielectric layer 5 is provided by depositing silicon nitride with a thickness of 150 nm on the metal oxide layer 4. Thus, the dielectric layer 5 is simply composed of silicon nitride, and the thickness is half or less than half the thickness of the conventional dielectric layer composed of three layers of the silicon oxide layer, the silicon nitride layer, and silicon oxide layer.

Figure 2E:
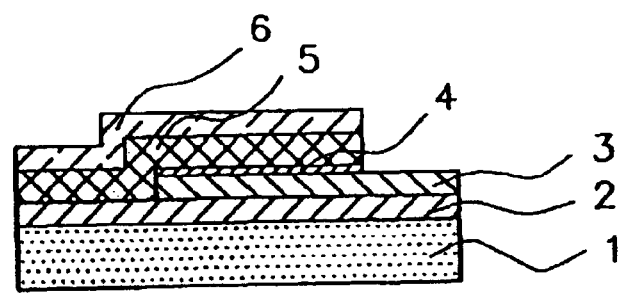

Next, for external connection of the lower electrode 3, the dielectric layer 5 and the metal oxide layer 4 are partly removed by selective etching to partly expose the lower electrode 3. Then, as shown in FIG. 2E, the upper electrode 6 is formed by depositing a plurality of metal layers in the same manner as forming the lower electrode. In the MIM capacitor of this embodiment, the upper electrode 6 is formed by depositing a titanium layer, a platinum layer, and a gold layer in that order.

Figure 2F:
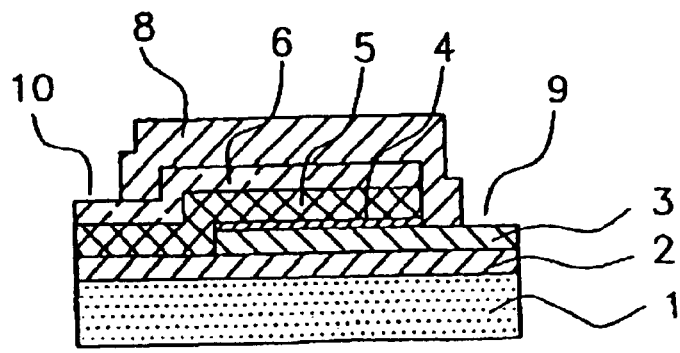

Next, the protective film 8 of silicon nitride is formed at 400° C. or less to improve the moisture resistance of the MIM capacitor, and a resist pattern having holes corresponding to the lower and the upper electrode openings 9 and 10 is formed. The protective film 8 in the holes of the resist pattern is removed by etching, and subsequently the resist is removed. Then the lower and the upper electrode openings 9 and 10 for externally connecting the MIM capacitor are provided as shown in FIG. 2F. Thus, the downsized high-capacity MIM capacitor having withstand voltage characteristics can be prepared.

Second Embodiment

Figure 3:
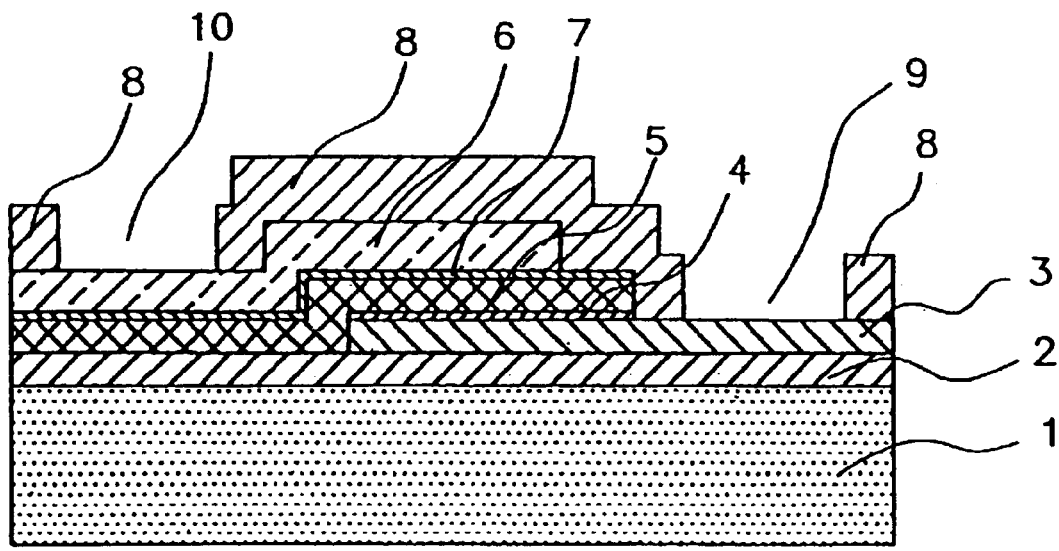
FIG. 3 is a sectional view of an MIM capacitor according to a second embodiment of the present invention.

FIGS. 3 and 4 illustrate an MIM capacitor and a manufacturing method therefor according to a second embodiment of the present invention.

The MIM capacitor according to a second embodiment of the present invention, as shown in FIG. 3, has substantially the same structure as that of the first embodiment. The difference from the first embodiment is in that an oxidized silicon nitride layer 7 is provided by oxidizing the surface of the dielectric layer 5. The oxidized silicon nitride layer 7 is highly insulative, thus improving the withstand voltage characteristics of the MIM capacitor.

A method of manufacturing the MIM capacitor will be described below, referring to FIGS. 4A to 4D. The manufacturing steps up to forming the dielectric layer 5 of the MIM capacitor according to the second embodiment are the same as those of the first embodiment. The steps after forming the dielectric layer 5 are illustrated in FIGS. 4A to 4D.

Figure 4A:
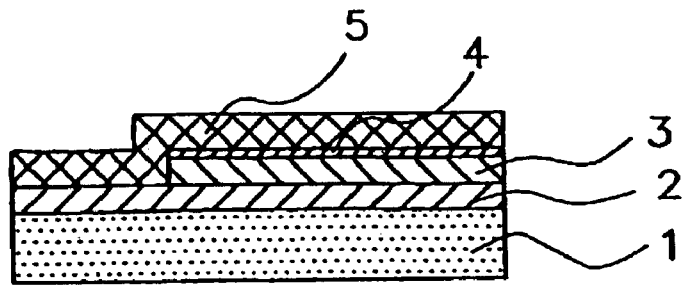
FIGS. 4A to 4D are process drawings of steps employed in manufacturing the MIM capacitor according to the second embodiment of the present invention.

First, as shown in FIG. 4A, the silicon nitride layer 2, the lower electrode 3, the metal oxide layer 4 formed by oxidizing the top layer of the lower electrode, and the dielectric layer 5 formed of silicon nitride are deposited on the Ga—As substrate 1 in that order.

Figure 4B:
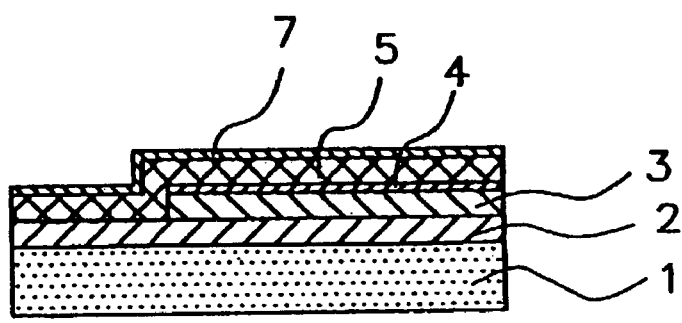

The surface of the dielectric layer 5, which is formed of silicon nitride, is oxidized in an oxygen atmosphere at 300° C. to form the oxidized silicon nitride layer 7 as shown in FIG. 4B. The oxidized silicon nitride layer is highly insulative; hence the dielectric layer 5 is to be positioned between highly insulative layers, namely the metal oxide layer 4 and the oxidized silicon nitride layer 7. Therefore the withstand voltage characteristics of the MIM capacitor of the second embodiment are improved in comparison with the MIM capacitor of the first embodiment.

Figure 4C:
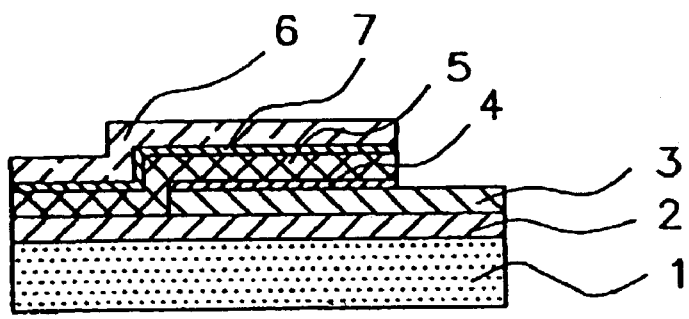
Figure 4D:
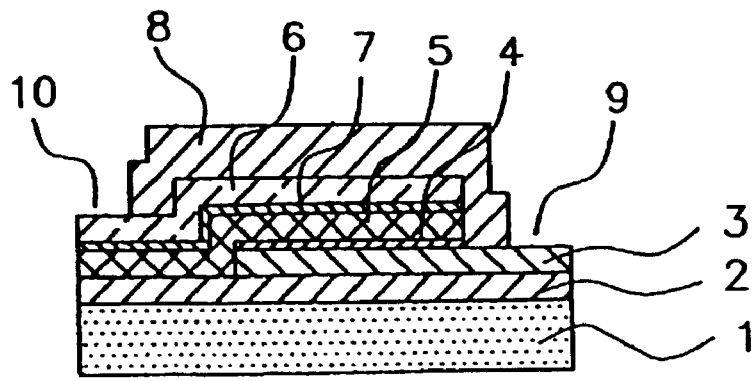

Next, for external connection of the lower electrode 3, part of the oxidized silicon nitride layer 7, the dielectric layer 5, and the metal oxide layer 4 are removed by selective etching to partly expose the lower electrode 3. Then, as shown in FIG. 4C, the upper electrode 6 is formed by depositing a plurality of metal layers, or titanium, platinum, and gold in that order, in the same manner as forming the upper electrode of the first embodiment.

Next, the protective film 8 of silicon nitride is formed at 400° C. or less in order to improve the moisture resistance of the MIM capacitor. Then, a resist pattern having holes corresponding to the lower and the upper electrode openings 9 and 10 is formed. The protective film in the holes of the resist pattern is removed by etching, and subsequently the resist is removed. Then the lower and the upper electrode openings 9 and 10 for externally connecting the MIM capacitor are provided as shown in FIG. 2F. Thus, the resulting downsized high-capacity MIM capacitor has further improved withstand voltage characteristics compared with the MIM capacitor of the first embodiment.

The embodiments describe the manufacturing method in which the lower and the upper electrodes 3 and 6 are formed by a vapor deposition and a lift-off process after forming the resist pattern having an inverse-tapered cross-section. However, the lower and the upper electrodes 3 and 6 may be completed by vapor deposition and a lift-off process after a step in which an electrode is provided by sputtering before forming the resist pattern for the lower and the upper electrodes 3 and 6.

The metal oxide layer 4 and the oxidized silicon nitride layer 7 are formed in an oxygen atmosphere in the embodiments, and alternatively formed by heating in an atmosphere containing an oxygen plasma or ozone.

As described above, the MIM capacitor of the present invention comprises the insulating metal oxide layer formed by oxidizing the top layer of the lower electrode, and thus the dielectric portion comprises the silicon nitride layer and the metal oxide layer. Thus, the withstand voltage characteristics of the MIM capacitor are improved. In addition, the metal oxide layer can be formed with a thin thickness, and the dielectric layer can be formed with a thin thickness. Consequently, a downsized high-capacity MIM capacitor can be obtained.

Also, by forming the highly insulative oxidized silicon nitride layer by oxidizing the surface of the dielectric layer, the MIM capacitor can have more improved withstand voltage characteristics.

The method of manufacturing the MIM capacitor of the present invention employs a common process of general MMICs, hence not requiring any additional special step when an MMIC comprises the MIM capacitor of the present invention. Also, since the dielectric layer is formed of silicon nitride, which has a high dielectric constant and is a common material, the MIM capacitor can be prepared at a low price.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of manufacturing an MIM capacitor, comprising:

providing a lower electrode comprising a plurality of metal layers including a top metal layer;

oxidizing the top metal layer of the lower electrode by heating at a temperature between 200 and 400° C. to form an insulative layer;

providing a dielectric layer on the insulative oxidized top metal layer; and providing an upper layer on the dielectric layer.

2. A method of manufacturing an MIM capacitor according to claim 1, wherein the dielectric layer is formed of silicon nitride.

3. A method of manufacturing an MIM capacitor according to claim 2, further comprising oxidizing the dielectric layer by heating at between 200 and 400° C.

4. A method of manufacturing an MIM capacitor according to claim 1, wherein the oxidizing of the top metal layer and the oxidizing of the dielectric layer are performed in an atmosphere containing oxygen.

5. A method of manufacturing an MIM capacitor according to claim 1, wherein the oxidizing of the top metal layer and the oxidizing of the dielectric layer are performed in an atmosphere containing an oxygen plasma or ozone.

6. A microwave monolithic integrated circuit comprising an MIM capacitor prepared by a manufacturing method as set forth in claim 1.

7. A method of manufacturing an MIM capacitor according to claim 1, wherein adjacent layers of said plurality of metal layers of the lower electrode include main elements which are made of different materials.

* * * * *